United States Patent [19]

Thatte et al.

[11] Patent Number: 4,597,080
[45] Date of Patent: Jun. 24, 1986

[54] ARCHITECTURE AND METHOD FOR TESTING VLSI PROCESSORS

[75] Inventors: Satish M. Thatte, Richardson; Thirumalai Sridhar, Dallas; David S. Ho, Garland; Han-Tzong Yuan; Theo J. Powell, both of Dallas, all of Tex.

[73] Assignee: Texas Instruments Incorporated, Dallas, Tex.

[21] Appl. No.: 551,648

[22] Filed: Nov. 14, 1983

[51] Int. Cl.$^4$ .................................. G01R 31/28
[52] U.S. Cl. ........................... 371/25; 324/73 R
[58] Field of Search ............... 371/25, 15; 324/73 R

[56] References Cited

U.S. PATENT DOCUMENTS

| | | | |
|---|---|---|---|
| 4,320,509 | 3/1982 | Davidson | 371/25 |
| 4,498,172 | 2/1985 | Bhavsar | 371/25 |
| 4,503,536 | 3/1985 | Panzar | 371/25 |
| 4,503,537 | 3/1985 | McAnney | 371/25 |

OTHER PUBLICATIONS

Konemann et al., Built-in Test for Complex Digital Integrated Circuits, Fifth European Solid State Circuits Conf., ESSCIRC 79, Southampton, England, Sep. 18–21, 1979, pp. 89–90.

Fasang, Circuit Module Implements Practical Self-Testing, Electronics, vol. 88, No. 1557, May 19, 1982, pp. 164–167.

Hahn et al., VLSI Testing by On-Chip Error Detection, IBM Tech. Disclosure Bulletin, vol. 25, No. 2, Jul. 1982, p. 709.

Carter, Improved Signature Test for VLSI Circuits, IBM Tech. Disclosure Bulletin, vol. 26, No. 3A, Aug. 1983 pp. 965–967.

Primary Examiner—Charles E. Atkinson
Attorney, Agent, or Firm—Kenneth C. Hill; Robert O. Groover; James T. Comfort

[57] ABSTRACT

A method and apparatus for testing VLSI processors using a bit-sliced bus-oriented data path include data and control monitors and BIT for the on-chip memory. The data monitor is used to compress output data produced by the data path. BIT implementation of a functional test coupled with the data monitor are used for an off-line self-test of the data path in field. The control monitor is used to decouple the testing task of the control section from that of the data path.

1 Claim, 3 Drawing Figures

ARCHITECTURE AND METHOD FOR TESTING VLSI PROCESSORS

The U.S. Government has a paid-up license in this invention and the right in limited circumstances to require the patent owner to license others on reasonable terms as provided for by the terms of contract No. F30602-81-C-0032 awarded by the U.S. Air Force.

BACKGROUND OF THE INVENTION

1. Field of the Invention

This invention relates to improvements in VLSI processor circuits, and more particularly to improvements in methods and apparatus for testing VLSI processor circuits at full speed, with on-chip VLSI circuitry.

2. Description of the Prior Art

As we enter the era of very large scale integration (VLSI), cost and complexity of testing VLSI circuits is becoming significant. The cost of chip failures depends on the levels at which they are detected, the higher the level, the more expensive is the detection and repair. It has been estimated that at each successive level in the hierarchy (chip, board, system, field), the cost of detecting, identifying and replacing faulty chips increases approximately by an order of magnitude. The importance of detecting faulty chips before they reach a board or a system cannot be overemphasized.

A typical single-chip VLSI processor consists of three major blocks, a data path, a control section for controlling the data path, and an on-chip memory. The data path consists of resources to store, manipulate, and transfer data, that is, it contains registers, an arithmetic and logic unit (ALU), and data buses. The current trend in VLSI design is to make the control section microprogrammed, and in such instances a microprogrammed control section is provided which generally consists of on-chip control ROM for storing microinstructions and a sequencer for generating the microinstruction address stream for the control ROM. In addition to the control ROM, on-chip memory on a VLSI processor includes a program ROM for storing machine level programs, and a data RAM for storing data. Examples of such single-chip VLSI processor is manufactured and sold by Texas Instruments Incorporated, Dallas, Tex. are microcomputers TMS 7000 and TMS 99000. Architectures of such prior microcomputers are discussed in articles by J. Hayn et al., "Strip architecture fits microcomputer into less silicon", Electronics, pp. 107–111, Jan. 27, 1981 and by D. Laffitte, "New-generation 16-bit microprocessors-fast and function-oriented", Electronic Design, pp. 111–117, Feb. 19, 1981.

In the semiconductor industry, a test set for the data path of a microprocessor or a microcomputer is typically generated manually, in the form of a machine language program to check its functionality. (The term "functional" is used herein to indicate that the test generation is on only the functional description of the data path to be tested, and not on its low level implementation details, such as logic diagrams and layout information.) The test generation process is very laborious, time consuming, and expensive. In rare circumstances when a test set is graded for its coverage of so called stuck-at faults (usually in response to a demand from major customers), the test designer painfully learns how difficult and expensive it becomes to improve the fault coverage from the initial figure (say a typical 80%) to an ambitious goal (typically over 95%). Though the time required to run a test set for the data path is not usually of paramount importance (the test time is dominated by on-chip memory tests), the large number of manually generated test patterns translates into a large test generation and grading cost, as well as a large amount of test data for a tester.

Though some of these problems are solved by using an automatic test pattern generation (ATPG) system, today's ATGP systems have their own set of problems. Even if an ATPG system is used, the cost of test grading and size of test data volume remains significant. ATPG becomes very expensive as the number of gates and degree of sequentiality (flip-flops) in a circuit increase. It has been suggested that the computer run time for test generation and fault simulation grows as a third power of the number of gates in a circuit. This observation strongly suggests that complex VLSI chips must be designed with the "divide-and-conquer" principle—a fundamental concept for implementing design for testability (DFT) techniques.

Another problem with today's ATPG systems is that they may generate illegal or invalid inputs as test patterns (for example, invalid control signals) that cause the circuit to get into an illegal state. Especially for MOS circuits, an illegal state may cause an unpredictable behavior of a good circuit, or even damage a circuit. Moreover, it may not be possible to generate and apply those invalid test patterns in a built in test (BIT) scenario. Most ATPG systems also require the so-called "equivalent" gate-level description of the circuit. Such a description is usually not available at an early stage of the design cycle when testability evaluation and test pattern generation activities are usually most appropriate. At this early stage what is available is a functional description of the data path. Therefore, at an early stage of design it is difficult to use today's ATPG systems.

Another point that should be brought out is that it is possible to generate a "structural" test set for the data path, using path sensitization techniques (such as the so-called D-algorithm) and its gate-level structural information. However, the test generation process for a structural test set must go through many iterations of test generation and test grading cycles, making it laborious and expensive. In addition to this drawback, the test patterns in a structural test set are unlikely to exhibit any regularity that would make them amenable for built in test (BIT) generation using simple hardware.

The control section of a processor decodes machine instructions and generates control signals for the data path and other logic. As mentioned, the control section of VLSI processors is expected to be microprogrammed rather than implemented with random logic, since a microprogrammed design not only shortens the design cycle time due to its regularity, but also helps improve testability. The test set for the control section is typically written as a machine language program, and testing is done in an indirect fashion by observing the output data produced by the data path. Consequently, the test generation process becomes quite complicated and the size of the test set becomes large, even for checking simple faults in the control section, such as incorrect machine instruction decoding. (See, for example, S. M. Thatte, "VLSI design for testability;" IEEE. Comput. Soc. Workshop on Fault-tolerant VLSI Design, Santa Monica, Calif. April, 1980, reported in IEEE Computer, Vol. 13, p. 53, Dec., 1980.) If faults causing incorrect sequencing or partial execution of instructions are considered, test generation procedures for generating test sets at the machine program level would become extremely complicated and difficult, if at all possible. Moreover, in a test set for the control section, if the output data produced by the data path is found to be incorrect, it becomes difficult to decide whether to locate the fault in the data path or in the control section, making the diagnosis of errors in prototype chips very difficult. In diagnosis, it is often required to generate control signals which cannot be generated by the control section in normal operation. The difficulties, both in testing as well as diagnosis, are attributed to poor observability as well as controllability of the control section.

Today, tests for on-chip memory on a VLSI processor chip may consume the bulk of the test time for the chip (typically over 80%), because the tests are usually run at the software level, with little hardware or firmware support. A typical ROM test, for instance, may consist of a machine language program to do a cyclic redundancy check on the ROM contents. Typical RAM tests consist of machine language programs implementing RAM testing algorithms, such as the GALPAT, MARCH, WALKING ONES, etc. In addition to large test times, a more serious problem is related to the test quality. Poor test quality stems from the fact that the speed of software-driven test pattern generation does not match the speed of on-chip memory, i.e., the test is not a full speed test. Therefore, such a test may not detect many timing-related problems that show up only at full speed.

It has been suggested to partition a complex circuit into smaller blocks, and use exhaustive combinations of all input patterns as a test set for each block. Examples of such partitioning can be seen in articles by E. J. McCluskey et al., "Design for autonomous test," IEEE Trans. on Comput., vol. C-30, pp. 866-875, Nov, 1981. and S. M. Thatte, "VLSI design for testability," supra.

SUMMARY OF THE INVENTION

In light of the above, it is, therefore, an object of the invention to provide an architecture for testable VLSI processors.

It is another object of the invention to provide an apparatus and method of the type and kind described for testing VLSI circuits and more particularly VLSI processors which provide cost-effective design for testability (DFT) and built-in test (BIT) techniques for VLSI processors, applicable for a variety of testing tasks, including diagnosis of prototype chips; full-speed functional testing during production and incoming inspection; and self-test in the field.

It is another object of the invention to provide a method and apparatus of the type and kind described in which a functional test generation methodology exploits bit-sliced architecture and is amenable to on-chip built-in implementation.

It is another object of the invention to provide an apparatus and method of the type and kind described in which a bit-sliced datapath is equipped with a "data monitor", a control section is equipped with a "control monitor", and built-in test of on-chip memory is provided to enhance testability.

It is another object of the invention to provide an apparatus and method of the type and kind described which provides a testable architecture and a rigorous functional test generation methodology for the data path.

It is another object of the invention to provide an apparatus and method of the type and kind described which eases the location of faults in either the data path or in the control section, allowing the correct diagnosis of errors in the control section in normal operation.

It is another object of the invention to provide an apparatus and method of the type and kind described which enables the decoupling of the testing task of the control section from that of the data path.

It is another object of the invention to provide an apparatus and method of the type and kind described in which a data monitor eliminates the need for storing individual expected test responses, either in an on-chip ROM for a BIT implementation, or in the tester memory, for external testing.

It is another object of the invention to provide an apparatus and method of the type and kind described in which many functional test patterns are generated on-chip, and the test results are compressed by means of the data monitor to substantially reduce the volume of test data.

The invention in its broad aspect, presents apparatus for testing a processor on a VLSI chip having a data path, a memory, and a control section, including input and output registers and combinational logic block. The apparatus includes a data monitor on said chip to receive and compress test result signals from said memory for developing a signature during testing. In addition, a control monitor is provided on said chip to receive and compress test result signals from said control section after passing through said data path for developing a signature during testing. Means are provided for generating functional test patterns on said chip, and applying said test patterns to said control section to produce responses to test patterns for said combinational block and loading and unloading a 1 and 0 to said input and output registers, as well as means for generating a test pattern sequence on said chip to address and read out each address of the the memory. Finally, means are provided for determining if the signatures accumulated in said control and data monitors are expected signatures indicative of a fault-free chip.

In another broad aspect of the invention, a method is presented for testing a VLSI processor having a bit-sliced data path, a microprogrammed control section, and an on-board memory, including the steps of providing a data monitor in the data path, configurable as a parallel signature analyzer during testing and providing a control monitor in the data path opposite the control section, configurable as a parallel signature analyzer during testing. Test patterns are generated to apply test patterns for combinational logic block testing and an output from said control section is accumulated in said control monitor. Each register-to-register transfer block (RTB) of the data path is loaded and unloaded with a 1 and 0. During this test, the control signals generated by said control section are accumulated in said control monitor. A determination is made whether the signature accumulated in said control monitor is an expected signature indicative of a fault-free control section. A test program is also provided to read the contents of a program and data memory, and it is determined whether the signature accumulated in the data monitor is an expected signature indicative of a fault-free memory system.

BRIEF DESCRIPTION OF THE DRAWINGS

The invention is illustrated in the accompanying drawings, in which.

DETAILED DESCRIPTION OF THE PREFERRED EMBODIMENTS

Figure 1:
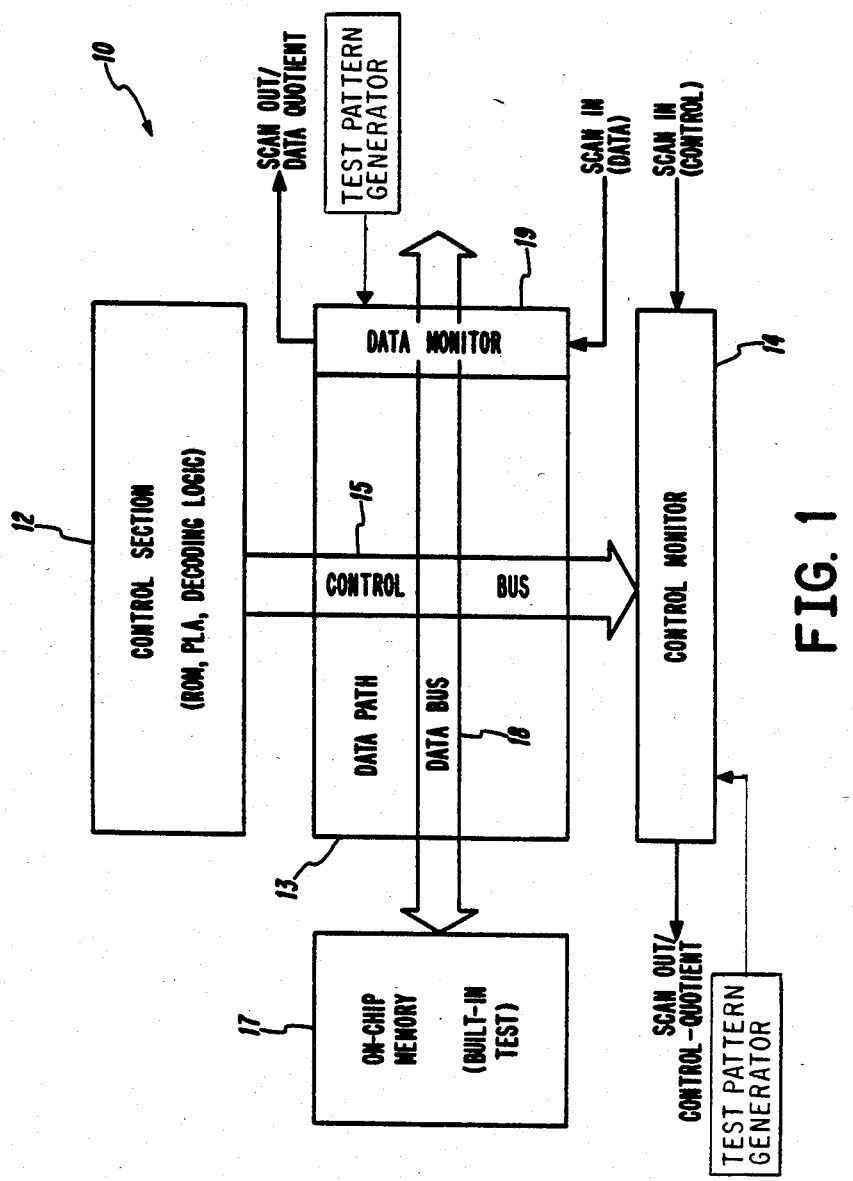
FIG. 1 is a block diagram showing the apparatus for testing VLSI processors, is accordance with the invention.

As shown in FIG. 1, a VLSI processor 10 includes a control section 12, which may include, for example, a ROM for containing control microinstructions, a PLA, decoding logic, etc. The output of the control section 12 is routed on a control bus 15 through a data path 13, and to a control monitor 14. An on-chip memory 17 is connected to a data bus 18 through the data path 13 to a data monitor 19, all as described below in detail. The control monitor 14 and data monitor 19 can be constructed in the same configuration as the parallel signature analyzer described, for example, in copending patent application, Ser. No. 551,667, filed Nov. 10, 1983, assigned to the assignee hereof, and entitled "Universal Testing Circuit and Method", said patent application being incorporated herein by reference. Additional details of parallel signature analyzers of the type which can be used in conjunction with the techniques of the invention can be found in an article by T. Sridhar et al., entitled "Analysis and simulation of parallel signature analyzers", International Test Conference, Philadelphia, PA, November, 1982, said article being incorporated herein by reference.

The solution for improving the testability of the control section, in accordance with the invention is based on the control monitor 14 which allows the decoupling of the testing task of the control section from that of the data path. The control monitor 14 is configured as a parallel signature analyzer to monitor control signals of the data path 13, and is preferably positioned as shown at one end of the data path with the control bus 15 driven from its other end by the control section 12. This preferred position enables the detection of many faults within the data path that affect signals of the control bus. If the control monitor is placed instead between the control section and the data path some of these faults, such as opens or breaks in control lines, may not be detected.

Figure 2:
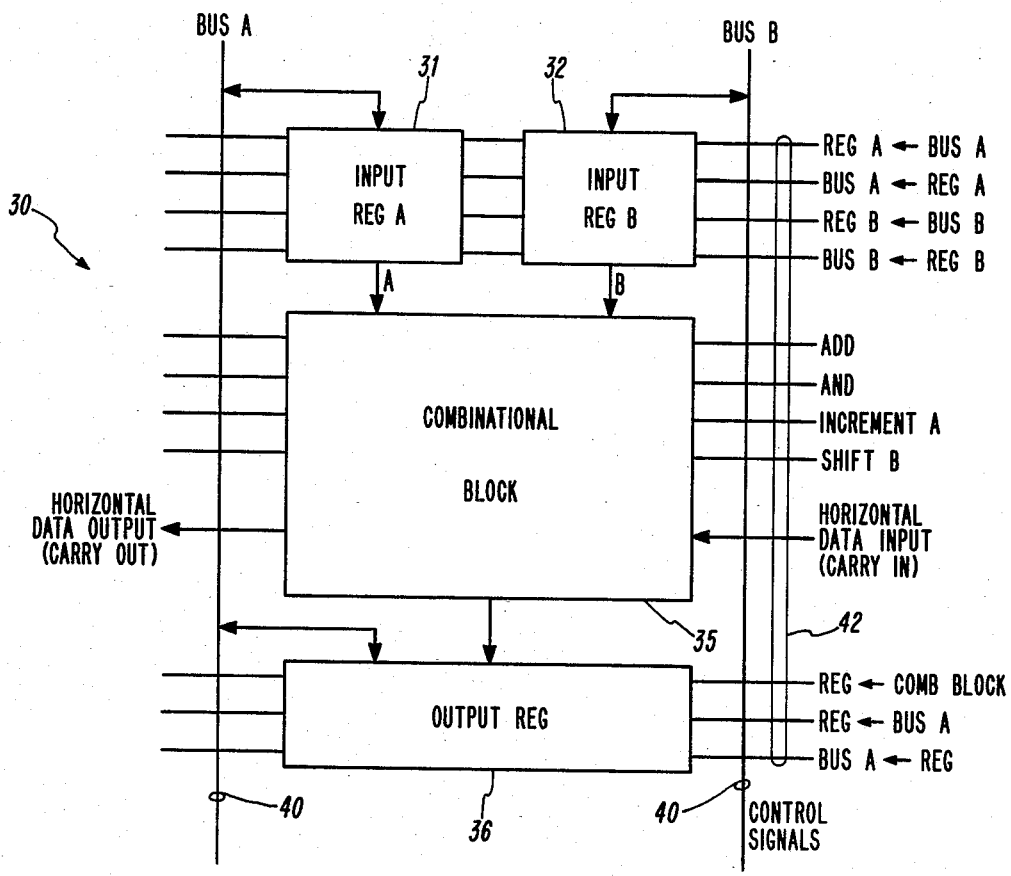
FIG. 2 is a model for a register-to-register transfer block (RTB) with which the method of testing, in accordance with the may be practiced.

In considering the testing of the datapath 13, consideration must be given to the structural regularity of bit-sliced architecture. A bus-oriented design effectively partitions each bit-slice into register-to-register transfer blocks (RTBs), such as counters, shifters, ALU's, etc., that can be independently tested. In the functional test generation method, of the invention, RTBs (instead of classical gates) are the primitives for test generation. As shown in FIG. 2, a model, for an RTB 30 consists of a set of input registers 31 and 32, a combinational block 35, and an output register 36. (For purposes of illustration, the RTB 30 FIG. 2 is an ALU, but it will be appreciated that the principles herein described apply equally to other RTB circuits, as outlined above.)

The RTB 30 may receive a set of control inputs on lines 40, and it performs a set of different operations (such as ADD, SUBTRACT, LOGICAL AND, etc.) depending on its control inputs. In a bus-oriented design, the input and output registers 31 and 32, and 36, respectively, of the RTB 30 are loaded and unloaded from a bus 42. Each register, 31, 32, and 36, and the combinational block 35 in the RTB 30 is described in terms of the set of functions it can perform in response to different control inputs. For example, Table 1 describes four functions performed by the combinational logic block 35 of the RTB 30, depending on the control inputs applied to it.

For each valid set of control inputs to the combinational block 35, its data inputs are partitioned into two sets, one set comprising the data inputs that affect the data output of the combinational block, (called the "do-care" data inputs). In Table 1 they are denoted by "Y". The second set of data inputs is the data inputs that do not affect any data output of the combinational block (called "don't-care" data inputs). In Table 1 they are denoted by "N".

TABLE 1

| Functions | Data Inputs | | |
|---|---|---|---|
| | A | B | Carry-in |
| ADD | Y | Y | Y |
| LOGICAL AND | Y | Y | N |
| INCREMENT A | Y | N | Y |
| SHIFT B | N | Y | Y |

It will be appreciated that since, in the proposed bus-oriented design in accordance with the invention, test patterns for the RTB 30 are directly applied to it from a bus, and need not be propagated to it via other RTBs, a test set needs to be generated only for each individual RTB, and not for an ensemble of RTBs, simplifying the test generation process. Moreover, the bit-sliced architecture simplifies the task of test generation even further. A bit-sliced data path is implemented by replicating a slice an appropriate number of times. In this design, data and control lines for a slice usually run in orthogonal directions, and the logic implemented in the silicon lies directly below the control and data lines. Thus, once the test set for an RTB in a single slice is generated, the test set for the complete RTB is generated by exploiting the structural regularity of the bit-sliced architecture in reducing the size of test sets.

In general, the functional test generation methodology for RTBs has two components: combinational block testing, and register testing. In combinational block testing, for each valid set of control inputs to a combinational block all combinations of only the Do-care data inputs are applied as test patterns. Once the test set for the combinational block of a single RTB is generated, the structural regularity of bit-sliced architecture is used to generate the test sequence for the set of replicated RTBs in the machine. The procedure of generating the test sequence for the set of replicated RTBs can be any well-known in the art, such as, for example that described by F. J. O. Dias, in "Truth-table verification of iterative logic arrays," IEEE Trans. Comput., vol. C-25, pp. 605–613, June 1976.

For example, with reference again to the combinational block 35 of the RTB 30 in FIG. 2, when the block is performing an "ADD" function, all three of its data inputs are the Do-care data inputs. Therefore 8 test patterns, which constitute an exhaustive combination of all three Do-care data inputs, form a functional test set for the ADD function. As shown by Dias, supra, the test set for the ADD function performed by an ALU built by replicating the RTB 30 is constructed from the 8 test patterns of the ADD function. Moreover, the size of the test sequence is independent of the number of such RTBs cascaded to implement the ALU. The test sequence for the ADD function performed by an 8-bit ALU is shown in Table 2.

TABLE 2

| A B | A B | A B | A B | A B | A B | A B | A B | C- |
|-----|-----|-----|-----|-----|-----|-----|-----|-----|
| 7 7 | 6 6 | 5 5 | 4 4 | 3 3 | 2 2 | 1 1 | 0 0 | IN |
| 0 0 | 1 0 | 1 1 | 0 1 | 1 1 | 1 0 | 0 1 | 0 0 | 0 |
| 0 0 | 0 0 | 1 0 | 1 1 | 0 1 | 1 1 | 1 0 | 0 1 | 0 |
| 0 1 | 0 0 | 0 0 | 1 0 | 1 0 | 0 1 | 1 1 | 1 0 | 0 |
| 1 0 | 0 1 | 0 0 | 0 0 | 1 0 | 1 1 | 0 1 | 1 1 | 0 |
| 1 1 | 1 0 | 0 1 | 0 0 | 0 0 | 1 0 | 1 1 | 0 1 | 1 |
| 0 1 | 1 1 | 1 0 | 0 1 | 0 0 | 0 0 | 1 0 | 1 1 | 1 |
| 1 1 | 0 1 | 1 1 | 1 0 | 0 1 | 0 0 | 0 0 | 1 0 | 1 |
| 1 0 | 1 1 | 0 1 | 1 1 | 1 0 | 0 1 | 0 0 | 0 0 | 1 |

In testing the registers of the RTB 30, each register must be tested for its ability to be loaded with a 1 and a 0 from each of its possible data inputs. Each register, similarly, must be tested for its ability to be unloaded on data buses, once when it stores a 1, and once when it stores a 0.

Thus, the functional test set applies exhaustive combinations of only the Do-care data inputs for each valid set of the control inputs. Therefore the test set consists of only valid and legal inputs as test patterns that are generated in a BIT implementation. Since the test set is not a truly exhaustive test set, its fault coverage must be analyzed. The test set generated for each function verifies the truth-table of the function. Therefore, the test set will detect many more types of faults, beyond most of the stuck-at faults. The faults that may not be caught are the ones that make a combinational logic into a sequential one, and the ones that are detected only by applying specific inputs to the Don't-care data inputs, or illegal signals on the control inputs.

As mentioned above, it has been suggested to partition a complex circuit into smaller block, and use exhaustive combinations of all input patterns as a test set for each block. We have found that for a typical data path, the size of the test set based on the method and apparatus of the invention is about one fourth the size of an exhaustive test set. Therefore the test time, as well as memory requirement for the BIT implementation using the proposed test set, will be about one-fourth the size of an exhaustive test set. Also, the generation of a test set based on the apparatus and method of the invention is simpler than an exhaustive test set, as the Don't-care inputs are simply ignored. An exhaustive test set must also take the Don't-care inputs into account and it complicates the process of overlapping the test sets for adjacent bit-slices. The loss in fault coverage for the proposed test set with respect to an exhaustive test set is quite small.

Figure 3:
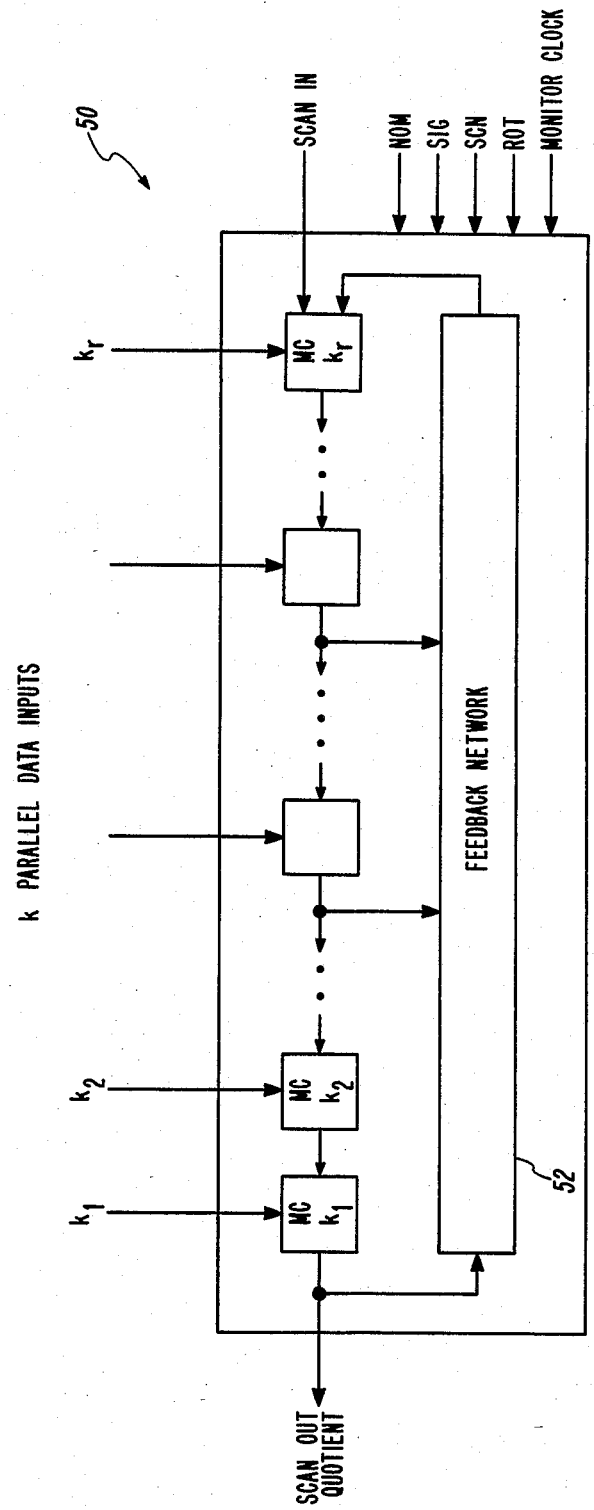
FIG. 3 is a block diagram of a monitor used for testing the data path and control section of the apparatus of FIG. 1, in accordance with the invention.

A block diagram of a monitor which is used as the data monitor 19 or control monitor 14 (see FIG. 1) is shown in FIG. 3, and denoted by the reference numeral 50. The monitor 50 is a k-bit wide monitor implemented with k monitor cells (denoted as MC) connected in cascade, and a feedback network 52. It has k parallel data inputs to be monitored, one serial data input, called SCAN-IN, one serial data output, called SCAN-OUT, four control signals, called NOM, SIG, SCN, and ROT, and a clock, called MONITOR-CLOCK. The four control signals, NOM, SIG, SCN, and ROT activate each one of the four modes of operation, namely NORMAL, SIGNATURE, SCAN, and ROTATE, as explained below in detail.

In the NORMAL mode, the monitor 50 is used to capture signal values on the parallel data inputs. The mode is used, for example, to capture the signals inside a chip that are not easily observable. In the SIGNATURE mode, the monitor behaves as a k-bit wide parallel signature analyzer compressing up to k parallel data inputs. The SIGNATURE mode of the monitor is similar to the "Multiple Input Signature Register" mode of the Built-in Logic Block Observer (BILBO) introduced by B. Konemann et al. in "Built-in test for complex digital integrated circuits", IEEE J. Solid-State Circuits, vol. SC-15, pp. 315–319, June, 1980, which article is incorporated herein by reference.

In operation, the signature is shifted out on the SCAN-OUT output by configuring the monitor into the SCAN mode. The SCAN mode is used to shift in serial data via the SCAN-IN input to initialize the monitor with a known state. The SCAN-OUT output of the most significant monitor cell and few other carefully selected cells is used as inputs to the feedback network 52. The feedback network consists of exclusive-or gates that implement the characteristic polynomial for performing signature analysis. Sometimes, it is desirable to shift the signature out, but still preserve the state of the monitor, i.e., preserve the accumulated signature so that a test experiment can resume after a signature is scanned-out at some intermediate point. This is easily achieved by performing a rotate operation (instead of a simple shift) on the monitor. The design of the least significant cell must be slightly modified to incorporate the FEEDBACK and ROTATE serial data inputs, in addition to the SCAN-IN input. All other cells have only SCAN-IN as serial data input. The MONITOR-CLOCK is a separate clock from the system clock, so that the monitors are operated completely independent of the the rest of the system, with its independent selectible clock frequency. Of course, it can also be operated in parallel with the system.

Signature analysis performed under the SIGNATURE mode is an excellent data compression technique if the errors in the data stream to be compressed are assumed to be random and independent, the probability of failing to detect an error using a k-bit wide parallel signature analyzer being approximated as $2^{-k}$.

The SCAN-OUT output of the monitor is also labeled "QUOTIENT" because it represents the quotient bit of the polynomial division process performed in signature analysis. One way to reduce the information loss is to monitor the QUOTIENT bit on every test cycle, in addition to monitoring the final signature accumulated in the monitor. For this reason, the QUOTIENT bit of a monitor implemented on a chip may be made available on a pin for external observation, if desired. Since the QUOTIENT output is the same as the SCAN-OUT output, there is no additional pin penalty for making the QUOTIENT observable.

In order to test the testability hardware, such as signature analyzers and scan paths, in accordance with our invention the monitor 50 uses the same rigorous functional test generation methodology that is used to generate functional test patterns for a bit-sliced data path. For each of the four modes of operation of a monitor, all possible combinations of only the Do-care data inputs are applied for each monitor cell. Then the iterative structure of a monitor is used to develop a test set for a monitor.

Testing of the data path 13, in accordance with the invention is accomplished by generating a number of functional test patterns, as follows. It can be observed that the test patterns for the ADD function shown in Table 2 exhibit a regularity: given the first test pattern in the sequence, the remaining 7 test patterns are generated by a ROTATE operation on the initial pattern. A number of functional test patterns for the operations performed by a bit-sliced data path can therefore be generated by using simple hardware such as counters and shifters, and providing them with some initialization patterns as "seeds" to generate additional test patterns. Such simple hardware may already exist in a data path. If the hardware is absent, usually the ALU of the data path is capable of performing "SHIFT," "ROTATE," and "INCREMENT" operations. This capability is used to generate additional test patterns using the seeds. Therefore, only the seeds must be supplied by an external tester. In a BIT scenario only the seeds are stored in an on-chip ROM. Thus, as far as the test data volume for test patterns is concerned, substantial reduction is achieved.

Even more substantial reduction in test data volume is achieved for the test result outputs using the data monitor. As shown in FIG. 1, the data monitor is used to monitor and compress the output data produced by the data path. The data monitor is under microprogram control, i.e., all four control signals are part of a field in microinstructions. During test operation, the data monitor is configured in the NORMAL mode to capture signal values on the parallel data inputs. During normal operation, the data monitor is used as a register in the data path. For example it is used as the ALU output register during normal operation. This hardware sharing reduces the silicon area penalty for the data monitor. The contents of the data monitor called "data signature" is either scanned out on the data scan-out pin by reconfiguring the data monitor in the SCAN mode, or is compared with the expected signature on the chip.

So far we have been concerned with BIT generation of data operands required for testing various operations performed by the data path. Sequences of microinstructions can also be developed to generate appropriate control signals for the data path. Two solutions are presented, the first solution, using a special microprogram that provides the exact sequence of microinstructions. The second solution depends on a machine instruction program to accomplish the same task. In such a test program, a number of additional microinstructions are executed to fetch machine instructions, manage other housekeeping chores, and perform the microinstructions required for test purposes.

As mentioned the control monitor 14 monitors the control signals of the data path 13 (FIG. 1). During every microinstruction cycle, the control section outputs a control vector on the "control bus" that consists of all control lines for the data path. When the control section drives the control bus, the control monitor is configured as a parallel signature analyzer monitoring all control lines in parallel. This mode of operation is used to perform an off-line test of the control ROM by reading out the entire ROM and inspecting the final signature accumulated in the control monitor. Functional tests for the microprogram sequencer is generated using the functional test generation procedure described in Section 3. The sequencer accesses specific locations in the control ROM during its test, and the control section, in turn, outputs a control vector on the control bus. The control vector stream generated during the sequencer test can also be compressed by the control monitor. The contents of the control monitor, called "control signature," are scanned out on the SCAN-OUT pin for external observation by reconfiguring the control monitor in the SCAN mode. Thus the control signals are tested completely independent of the data path, achieving the goal of decoupling of the testing task of the control section from that of the data path.

Using the control monitor 14 in the NORMAL mode each individual control signal vector (same as a microinstruction in a horizontal microinstruction format) is captured. The captured vector is shifted out for external observation by reconfiguring the control monitor in the SCAN mode. Similarly a control vector is driven into the control monitor using a tester via its SCAN-IN input, and then the control bus of the data path is driven by control monitor. Thus, using the control monitor, any control vector generated by the control section is observed, and any desired control vector can be driven into the control monitor and then used to drive the data path. This feature is especially helpful in the debug and diagnosis process of prototype chips.

The QUOTIENT output of the control monitor, called the CONTROL-QUOTIENT is made available for external observation, like the DATA-QUOTIENT. These two quotient bits are thought to represent the "essence" of activities in the data path and control section. A high reliability duplex scheme is implemented by comparing the DATA-QUOTIENT and the CONTROL-QUOTIENT bits of two identical processor chips on each cycle. Similarly a fault-tolerant triplex scheme is implemented by voting on the DATA-QUOTIENT and the CONTROL-QUOTIENT bits of three identical processors.

It should be noted that the data and control monitors described can be used to equal advantage in concurrent program flow testing, as described in detail in copending patent application Ser. No. 551,658, filed Nov. 14, 1983, entitled "METHOD AND APPARATUS FOR CONCURRENT CHECKING OF PROGRAM FLOW IN VLSI PROCESSORS", and assigned to the assignee hereof, said application being incorporated herein by reference.

Although the invention has been described and illustrated with a certain degree of particularity, it is understood that the present disclosure has been made by way of example only and that numerous changes in the arrangement and combination of parts and steps may be resorted to by those skilled in the art without departing from the spirit and the scope of the invention, as hereinafter claimed.

We claim:

1. Apparatus for testing a processor on a VLSI chip having a data path, a memory, and a control section, comprising:
a data monitor on said chip, wherein said data monitor can be selected to operate in a normal mode or a test mode, and wherein said data monitor when operating in test mode receives and compresses signals from the data path and develops a signature indicative of success or failure during test;
a control monitor on said chip, wherein said control monitor can be selected to operate in a normal mode or test mode, wherein said control monitor when operating in the normal mode receives and compresses signals from the control section after such signals pass through the data path to develop a signature indicative of success or failure during test, and wherein said control monitor when operating in the test mode can supply control signals to the control section in order to test desired modes of operation, and further wherein said control monitor and said data monitor can both operate in test mode simultaneously; and a test pattern generator for generating test patterns for application to said data and control monitors, wherein the test patterns, when so applied, cause the functions of the processor to be exercised and signals to be produced which are coupled to said data and control monitors, wherein the signatures indicative of success of failure during test are generated after the test patterns are generated.

* * * * *